United States Patent
Funakoshi

(10) Patent No.: US 8,683,421 B2
(45) Date of Patent: Mar. 25, 2014

(54) WIRE HARNESS CONTINUITY INSPECTION METHOD AND WIRE HARNESS CONTINUITY INSPECTION PROGRAM

(75) Inventor: Shigeo Funakoshi, Shizuoka (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 13/643,309

(22) PCT Filed: May 27, 2011

(86) PCT No.: PCT/JP2011/062268
§ 371 (c)(1), (2), (4) Date: Oct. 25, 2012

(87) PCT Pub. No.: WO2011/149078
PCT Pub. Date: Dec. 1, 2011

(65) Prior Publication Data
US 2013/0061197 A1    Mar. 7, 2013

(30) Foreign Application Priority Data
May 28, 2010 (JP) .................................. 2010-123349

(51) Int. Cl.
*G06F 17/50* (2006.01)
(52) U.S. Cl.
USPC ............ 716/136; 716/126; 716/130; 716/131
(58) Field of Classification Search
USPC .................................. 716/126, 130, 131, 136
See application file for complete search history.

(56) References Cited

U.S. PATENT DOCUMENTS

| 2,768,428 | A | * | 10/1956 | MacGregor et al. ............. 29/755 |
| 4,859,953 | A | * | 8/1989 | Young et al. .................. 324/539 |
| 5,268,644 | A | | 12/1993 | Klassen et al. |
| 5,661,453 | A | * | 8/1997 | Justus et al. ................... 340/438 |

(Continued)

FOREIGN PATENT DOCUMENTS

| EP | 0 164 570 A2 | 12/1985 |
| EP | 0 450 806 A2 | 10/1991 |
| JP | 2000163453 A | 6/2000 |
| JP | 2008300246 A | 12/2008 |

OTHER PUBLICATIONS

International Search Report (PCT/ISA/210) dated Aug. 23, 2011 issued by the International Searching Authority in counterpart International Application No. PCT/JP2011/062268.

(Continued)

*Primary Examiner* — Sun Lin
(74) *Attorney, Agent, or Firm* — Sughrue Mion, PLLC

(57) ABSTRACT

It is possible to optimize the time required for a success/failure determination step and the accuracy of the success/failure determination step by determining region-based connector/wiring information to be created and increasing or decreasing the number of patterns of the region-based connector/wiring information. When a wire harness is arranged in each partitioned area of a vehicle space, specifications satisfied by the vehicle are referenced, region-based connector/wiring information described for a wire harness arranged in each partitioned area realizing a predetermined specification is created, and the presence/absence of errors in connections of electric wires is inspected for the created region-based connector/wiring information.

7 Claims, 8 Drawing Sheets

(56) References Cited

U.S. PATENT DOCUMENTS

| | | | |
|---|---|---|---|
| 5,718,603 A * | 2/1998 | Watanabe et al. | 439/489 |
| 6,124,716 A * | 9/2000 | Kanamori | 324/538 |
| 6,457,165 B1 | 9/2002 | Ishikawa et al. | |
| 6,844,496 B2 * | 1/2005 | Matsuda et al. | 174/72 A |
| 7,006,681 B2 * | 2/2006 | Maeda et al. | 382/141 |
| 7,275,317 B2 * | 10/2007 | Kamata et al. | 29/857 |
| 7,403,829 B2 * | 7/2008 | Yamane | 700/97 |
| 7,403,876 B2 * | 7/2008 | Tsuchiya et al. | 703/1 |
| 7,409,080 B2 * | 8/2008 | Maeda et al. | 382/141 |

OTHER PUBLICATIONS

Written Opinion (PCT/ISA/237) dated Aug. 23, 2011 issued by the International Searching Authority in counterpart International Application No. PCT/JP2011/062268.

Office Action issued Jul. 30, 2013, by the Japanese Patent Office in corresponding application No. 2010-123349.

Extended Search Report dated Oct. 23, 2013 issued by the European Patent Office in corresponding European Patent Application No. 11786775.4.

* cited by examiner

FIG.3
(a)
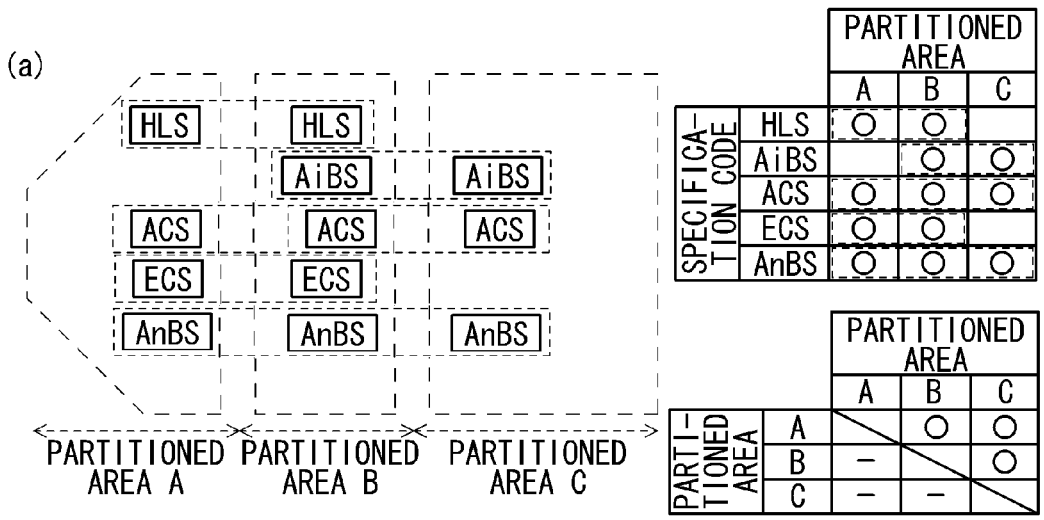
(b)
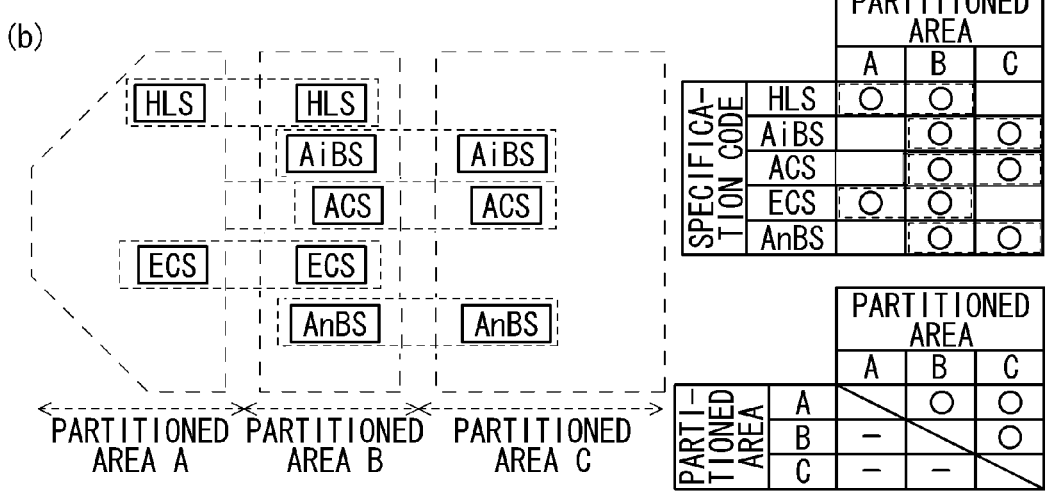

FIG.7

| No | PARTITIONED AREA | | | | NEED FOR CREATION | |
|---|---|---|---|---|---|---|
| | A | B | C | | | |
| 1 | A-1 | B-1 | C-1 | | ○ | 1 |
| 2 | A-1 | B-1 | C-2 | | × | |
| 3 | A-1 | B-1 | C-3 | | × | |
| 4 | A-1 | B-2 | C-1 | | ○ | 2 |
| 5 | A-1 | B-2 | C-2 | | × | |
| 6 | A-1 | B-2 | C-3 | | × | |
| 7 | A-1 | B-3 | C-1 | | ○ | 3 |
| 8 | A-1 | B-3 | C-2 | | × | |
| 9 | A-1 | B-3 | C-3 | | × | |
| 10 | A-2 | B-1 | C-1 | | ○ | 4 |
| 11 | A-2 | B-1 | C-2 | | × | |
| 12 | A-2 | B-1 | C-3 | | × | |
| 13 | A-2 | B-2 | C-1 | | ○ | 5 |
| 14 | A-2 | B-2 | C-2 | | × | |
| 15 | A-2 | B-2 | C-3 | | × | |
| 16 | A-2 | B-3 | C-1 | | ○ | 6 |
| 17 | A-2 | B-3 | C-2 | | × | |
| 18 | A-2 | B-3 | C-3 | | × | |
| 19 | A-3 | B-1 | C-1 | | ○ | 7 |
| 20 | A-3 | B-1 | C-2 | | × | |
| 21 | A-3 | B-1 | C-3 | | × | |
| 22 | A-3 | B-2 | C-1 | | ○ | 8 |
| 23 | A-3 | B-2 | C-2 | | × | |
| 24 | A-3 | B-2 | C-3 | | × | |
| 25 | A-3 | B-3 | C-1 | | ○ | 9 |
| 26 | A-3 | B-3 | C-2 | | × | |
| 27 | A-3 | B-3 | C-3 | | × | |

FIG.8

| No | PARTITIONED AERA | | | SPECIFICATION SATISFIED BY VEHICLE | NEED FOR CREATION | |
|---|---|---|---|---|---|---|
| | A | B | C | | | |
| 1 | A-1 | B-1 | C-1 | HLS, AiBS, ACS, ECS, AnBS | O | 1 |
| 2 | A-1 | B-1 | C-2 | AnBS | × | |
| 3 | A-1 | B-1 | C-3 | HLS, AiBS, ACS, ECS, AnBS | O | 2 |
| 4 | A-1 | B-2 | C-1 | HLS, AiBS, ACS, ECS | O | 3 |
| 5 | A-1 | B-2 | C-2 | HLS, AiBS | × | |
| 6 | A-1 | B-2 | C-3 | ECS, AnBS | × | |
| 7 | A-1 | B-3 | C-1 | HLS, AiBS, ECS, AnBS | O | 4 |
| 8 | A-1 | B-3 | C-2 | HLS, AiBS, ACS, ECS, AnBS | O | 5 |
| 9 | A-1 | B-3 | C-3 | HLS, ECS, AnBS | × | |
| 10 | A-2 | B-1 | C-1 | HLS, AiBS, ECS, AnBS | O | 6 |
| 11 | A-2 | B-1 | C-2 | ECS, AnBS | × | |
| 12 | A-2 | B-1 | C-3 | HLS, AiBS, ACS, ECS, AnBS | O | 7 |
| 13 | A-2 | B-2 | C-1 | HLS, AiBS, ACS, ECS, AnBS | O | 8 |
| 14 | A-2 | B-2 | C-2 | ECS, AnBS | × | |
| 15 | A-2 | B-2 | C-3 | HLS, AiBS, ACS, ECS, | × | |
| 16 | A-2 | B-3 | C-1 | HLS, AiBS, ACS, ECS, AnBS | O | 9 |
| 17 | A-2 | B-3 | C-2 | AiBS, ACS, AnBS | × | |
| 18 | A-2 | B-3 | C-3 | | × | |
| 19 | A-3 | B-1 | C-1 | HLS, AiBS, ECS, AnBS | O | 10 |
| 20 | A-3 | B-1 | C-2 | ECS, AnBS | × | |
| 21 | A-3 | B-1 | C-3 | HLS, AiBS, ACS, ECS, AnBS | O | 11 |
| 22 | A-3 | B-2 | C-1 | HLS, AiBS, ECS, AnBS | O | 12 |
| 23 | A-3 | B-2 | C-2 | ECS, AnBS | × | |
| 24 | A-3 | B-2 | C-3 | | × | |
| 25 | A-3 | B-3 | C-1 | HLS, AiBS, ACS, ECS, AnBS | O | 13 |
| 26 | A-3 | B-3 | C-2 | HLS, ECS | × | |
| 27 | A-3 | B-3 | C-3 | HLS, AiBS, ACS, | × | |

US 8,683,421 B2

WIRE HARNESS CONTINUITY INSPECTION METHOD AND WIRE HARNESS CONTINUITY INSPECTION PROGRAM

TECHNICAL FIELD

The present invention relates to a wire harness continuity inspection method and a wire harness continuity inspection program for comparing connection between the starting point and the terminating point of a circuit line described in auxiliary device-based wiring information (specifically, auxiliary device-based wiring information created for each grade of a vehicle model and depending on the presence/absence of an optional function), created for a certain vehicle model and including wiring information on electric wires and connectors connected to an auxiliary device, with connection of electric wires described in region-based connector information including connector information constituting a wire harness designated for each partitioned area and region-based wiring information including wiring information constituting the wire harnesses designated for each partitioned area (the region-based connector information is an actual wiring diagram created based on the auxiliary device-based wiring information, and the region-based wiring information is a diagram expanded based on an auxiliary device specification table of the vehicle model; hereinafter, the region-based connector information and the region-based wiring information will be collectively referred to as "region-based connector/wiring information"), and inspecting the presence/absence of an error in a connection of electric wires described in the region-based connector/wiring information.

BACKGROUND ART

When designing wire harnesses arranged in a certain vehicle, it is necessary to create a design drawing which shows connections of electric wires constituting the wire harnesses. Hereinafter, a procedure of designing wire harnesses will be described.

When designing wire harnesses arranged in a certain vehicle, two specifications of auxiliary device-based wiring information and an auxiliary device specification table of the vehicle are necessary. First, auxiliary device-based wiring information and an actual wiring diagram created on the basis of the auxiliary device-based wiring information will be described. In recent years, the auxiliary device-based wiring information and the actual wiring diagram may be designed by CAD (Computer Aided Design) (for example, see Patent Literature 1).

The auxiliary device-based wiring information is prepared for each of the systems, such as a head lamp system, an airbag system, an air-conditioning system, an engine control system, and an antilock brake system, which are mounted in a vehicle and separately driven. In order to drive the system, it is necessary to connect electrical components (for example, a battery, an ECU (Electronic Control Unit), and a driving machine) constituting the system by a signal line, a power line, and a ground line. The auxiliary device-based wiring information includes circuit line connection information representing terminals of an electrical component to which the starting point and the terminating point of each of the electric wires of the signal line, the power line, and the ground line are connected, and electric wires to which the signal line, the power line, and the ground line are connected, and auxiliary device information on an auxiliary device which connects the electric wires of the signal line, the power line, and the ground line to the electrical component. Since the auxiliary device-based wiring information mainly aims to represent a circuit diagram of a system having a plurality of electrical components, information on electric wires is not included therein.

Accordingly, an actual wiring diagram in which information on the electric wires is added to the auxiliary device-based wiring information is created. In the actual wiring diagram, the information on the electric wires is added to the circuit lines which connect electrical components together and are described in the auxiliary device-based wiring information, and a vehicle space is functionally divided into respective areas (an engine compartment, a vehicle interior wall, or a trunk; hereinafter these areas will be referred to as partitioned areas) where wire harnesses are arrangeable. For example, when a circuit line described in the auxiliary device-based wiring information extends over a plurality of partitioned areas and is connected to a plurality of electrical components, information on terminals or connectors connected to the terminals of the electrical component at the starting point and the terminating point of the circuit line is described in the actual wiring diagram. Information on respective electric wires positioned in the partitioned areas (since wire harnesses are arranged in the respective partitioned areas, it is necessary to connect the terminals of a plurality of electrical components by connecting the electric wires of the respective partitioned areas) is also described in the actual wiring diagram. Information on auxiliary devices, such as a connector, a JB {(Electric) Junction Box}, and a JC (Joint Connector) for connecting the end portions of electric wires positioned in the respective partitioned areas (when the end portions of electric wires are connected through welding or butt-joining, information of this effect) is described in the actual wiring diagram. The actual wiring diagram in which the information on electric wires is described in this way is created for each system mounted in the vehicle.

Subsequently, an auxiliary device specification table will be described.

In the auxiliary device specification table, the configuration (a part number of the wire harness, a combination of specifications which are applicable to the wire harness, identification information of applicable vehicles in which the wire harness is arrangeable, and arrangeable partitioned areas of the applied vehicle) of a general-purpose wire harness is described in a matrix for each wire harness.

Subsequently, region-based connector/wiring information is created on the basis of the actual wiring diagram and the auxiliary device specification table created in this way. The region-based connector/wiring information describes a wire harness arrangeable in each partitioned area of a target vehicle while including the electric wires described in the actual wiring diagram (that is, while enabling all systems mounted in the vehicle to be driven). When creating the region-based connector/wiring information, a wire harness arrangeable in the partitioned area is schematically specified from the auxiliary device specification table through a subsequent step. First, a required specification code necessary for driving all the systems in the partitioned area is specified with reference to the actual wiring diagram of all systems mounted in the vehicle. A wire harness including a combination of all specifications is specified with reference to the specified specification code. This step is executed for all partitioned areas, whereby a wire harness arrangeable in each partitioned area of the target vehicle is specified.

After performing the region-based connector/wiring information creation step of creating the region-based connector/wiring information, a success/failure determination step of determining whether or not the description of the auxiliary device-based wiring information is identical to the description of the region-based connector/wiring information is performed. That is, it is determined whether or not the starting point and the terminating point of a circuit line connecting electrical components in the auxiliary device-based wiring information are identical to the starting point and the terminating point of connections of electric wires connecting electrical components in the region-based connector/wiring information.

CITATION LIST

Patent Literature

Patent Literature 1: JP-A-2000-163453

SUMMARY OF INVENTION

Technical Problem

When creating the region-based connector/wiring information by specifying a wire harness arrangeable in each partitioned area of the target vehicle, there may be a plurality of candidates for the wire harness arrangeable in the partitioned area. When the vehicle space is partitioned into three partitioned areas, and candidates for a wire harness arrangeable in the partitioned area are two patterns, the region-based connector/wiring information is created in 8 (2×2×2) patterns, and the success/failure determination step should be executed for each pattern.

However, as the number of candidates for a wire harness arrangeable in a partitioned area increases, the number of pieces of region-based connector/wiring information increases. As a result, it takes a lot of time to perform the success/failure determination step which is executed on each piece of the region-based connector/wiring information. A case where the number of patterns of region-based connector/wiring information to be created is narrowed down to shorten the time required for the success/failure determination step is considered. However, the accuracy of the success/failure determination step is lowered depending on the narrowing method. In this way, the time required for the success/failure determination step and the accuracy of the success/failure determination step have a trade-off relationship, and it is preferable that region-based connector/wiring information to be created is determined, and the number of patterns increases or decreases, thereby optimizing the time and the accuracy.

The present invention has been accomplished in consideration of this situation, and an object of the present invention is to provide a wire harness continuity inspection method and a wire harness continuity inspection program capable of optimizing the time required for a success/failure determination step and the accuracy of the success/failure determination step by determining region-based connector/wiring information to be created and increasing or decreasing the number of patterns of the region-based connector/wiring information.

Solution to Problem

In order to attain the above-described object, a wire harness continuity inspection method according to the present invention is characterized by the following aspects (1) and (2).
(1) A wire harness continuity inspection method includes:
a reference step of referencing specifications satisfied by a vehicle in which a wire harness is arranged in each partitioned area of a vehicle space;

a creation step of creating region-based connector/wiring information described for a wire harness arranged in each partitioned area for realizing a predetermined specification; and an inspection step of inspecting the presence/absence of an error in a connection of electric wires in the created region-based connector/wiring information.

(2) A wire harness continuity inspection method includes:
a first specification step of specifying a predetermined first partitioned area from among partitioned areas in to which a vehicle space is partitioned, and a creation step of creating region-based connector/wiring information described for at least a predetermined wire harness from among first wire harnesses arrangeable in the first partitioned area.

In order to attain the above-described object, a wire harness continuity inspection program according to the present invention is characterized by the following aspect (3).

(2) A wire harness continuity inspection program causes a computer to execute the steps of the wire harness continuity inspection method of the aspect (1) or (2).

According to the wire harness continuity inspection method of the aspect (1) or (2) and the wire harness continuity inspection program of the aspect (3), it is possible to optimize the time required for a success/failure determination step and the accuracy of the success/failure determination step by determining region-based connector/wiring information to be created and increasing or decreasing the number of patterns of the region-based connector/wiring information.

Advantageous Effects of Invention

According to the wire harness continuity inspection method and the wire harness continuity inspection program of the present invention, it is possible to optimize the time required for a success/failure determination step and the accuracy of the success/failure determination step by determining region-based connector/wiring information to be created and increasing or decreasing the number of patterns of the region-based connector/wiring information.

The present invention has been described briefly. The details of the present invention will be more clearly understood by reading Description of Embodiments with reference to the accompanying drawings.

BRIEF DESCRIPTION OF DRAWINGS

FIG. 3 is a diagram for explaining the presence/absence of connection of partitioned areas in a wire harness continuity inspection method according to an embodiment of the present invention, specifically, FIG. 3(a) relates to a vehicle A, and FIG. 3(b) relates to a vehicle B.

FIG. 7 is a diagram for explaining an example of the relationship of need for creation of region-based connector/wiring information.

FIG. 8 is a diagram for explaining another example of the relationship of need for creation of region-based connector/wiring information.

DESCRIPTION OF EMBODIMENTS

Hereinafter, a wire harness continuity inspection method according to an embodiment of the present invention will be described.

Prior to describing the wire harness continuity inspection method according to the embodiment of the present invention, first, an example of a success/failure determination step of determining success/failure on whether or not the starting point and the terminating point of a circuit line connecting electrical components in auxiliary device-based wiring information are identical to the starting point and the terminating point of an electric wire connecting electrical components in region-based connector/wiring information will be described.

[Overview of Success/Failure Determination Step]

Figure 1:
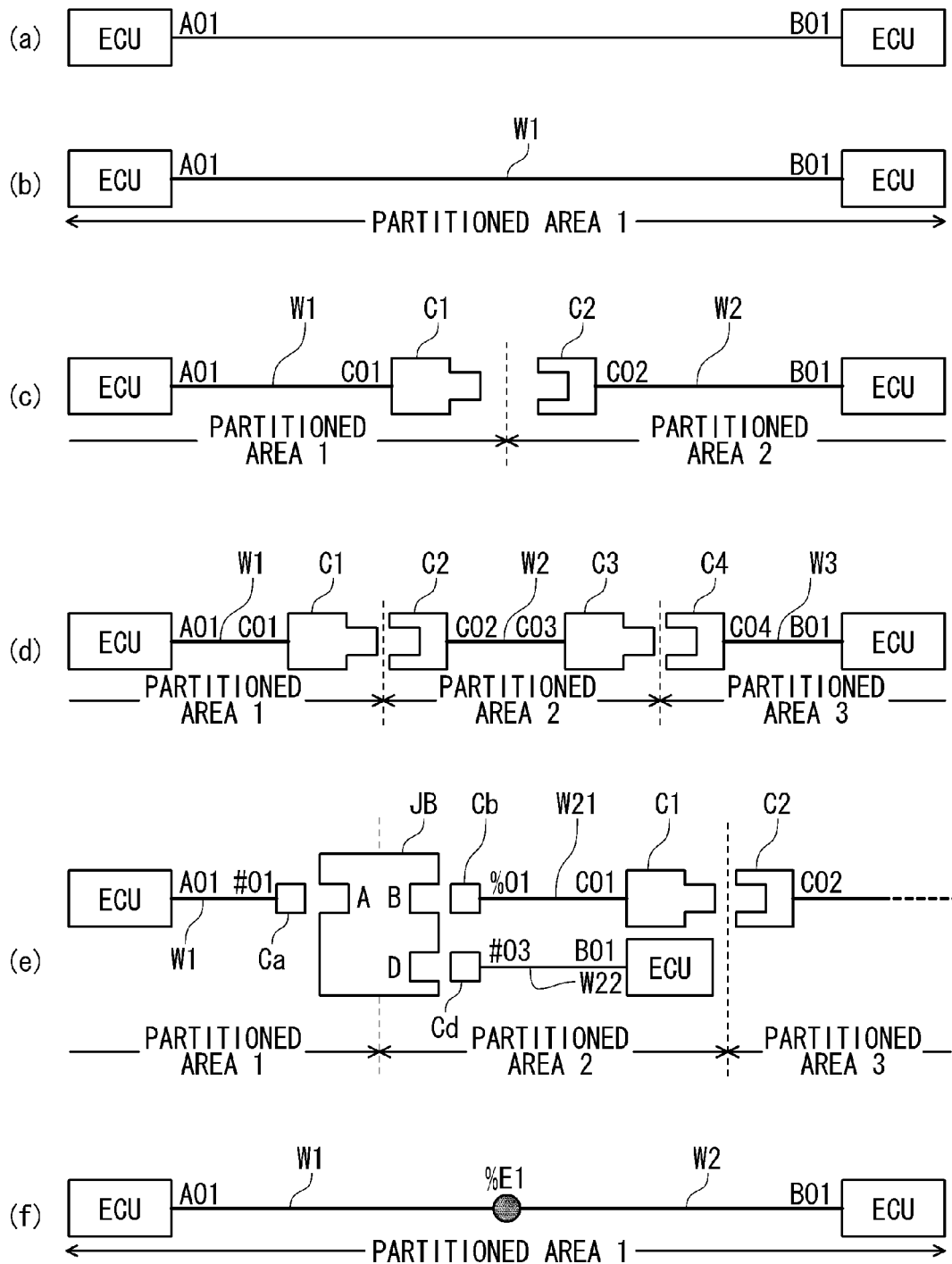
FIG. 1(a) is a schematic view of a circuit line connecting electrical components described in auxiliary device-based wiring information.
FIGS. 1(b) to 1(f) are schematic views of connections of electric wires connecting electrical components described in region-based connector/wiring information.
Figure 2:
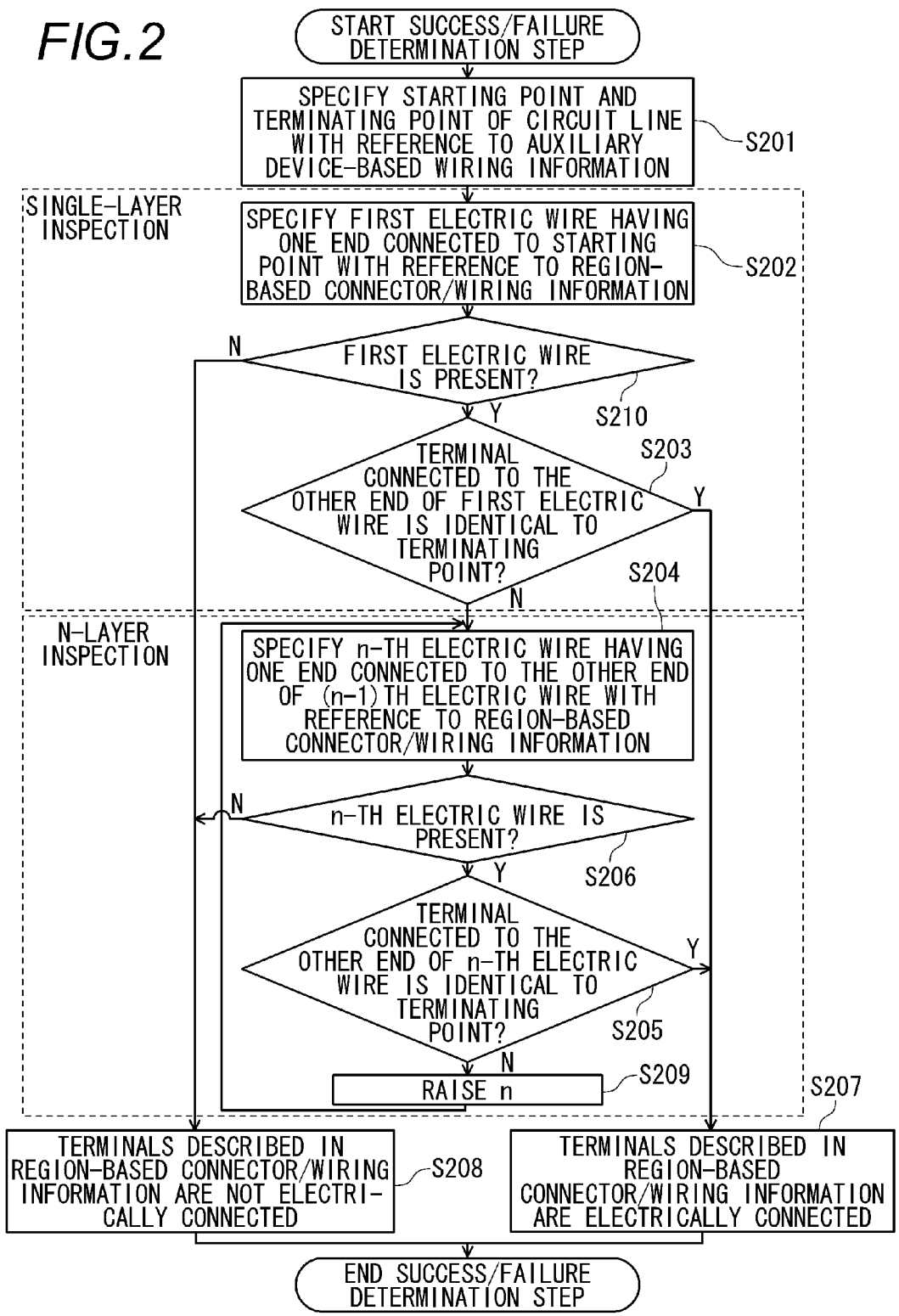
FIG. 2 is a flowchart for explaining processing in a failure determination step.

FIGS. 1(a) to 1(f) are a schematic view (FIG. 1(a)) of a circuit line connecting electrical components described in auxiliary device-based wiring information, and schematic views (FIGS. 1(b) to 1(f)) of connections of electric wires connecting electrical components described in region-based connector/wiring information. FIG. 2 is a flowchart for explaining processing in a success/failure determination step.

As described in "Background Art", the auxiliary device-based wiring information includes circuit line connection information representing an electrical component and terminals of the electrical component to which the starting point and the terminating point of each of the electric wires of these signal line, power line, and ground line are connected, and electric wires to which the signal line is connected. In FIG. 1(a), two ECUs which are electrical components are described, and a terminal "A01" of one of the ECUs is connected to a terminal "B01" of the other ECU through a circuit line. First, a first terminal ("A01") of a first electrical component (ECU) and a second terminal ("B01") of a second electrical component (ECU) connected by the circuit line described in the auxiliary device-based wiring information is referenced from the auxiliary device-based wiring information (reference step: S201).

On the other hand, as described in "Background Art", the region-based connector/wiring information describes a wire harness arrangeable in each partitioned area of a target vehicle while including the electric wires described in the actual wiring diagram (that is, while satisfying a required specification). To this end, a first electric wire having one end connected to the first terminal ("A01") of the first electrical component (ECU) described in the region-based connector/wiring information is specified on the basis of the wire harness information described in the region-based connector/wiring information with reference to the region-based connector/wiring information (first specification: S202).

In "Overview of Success/Failure Determination Step", a case where the first electric wire can be specified from the region-based connector/wiring information will be hereinafter described.

In FIGS. 1(b) to 1(f), the line width of the electric wire having one end connected to the first terminal ("A01") of the first electrical component (ECU) is larger than that of the circuit line of FIG. 1(a). In this way, the circuit line and the electric wire are distinguished from each other in FIGS. 1(a) to 1(f). However, two electrical components are often arranged over a plurality of partitioned areas. In this case, respective wire harnesses arranged in respective partitioned areas are connected such that the terminals of the two electrical components are connected. Accordingly, it may not be said that the other end of the first electric wire W1 specified in the first specification step is connected to the second terminal ("B01") of the second electrical component (ECU) in the same partitioned area 1 as shown in FIG. 1(b).

Accordingly, based on such a situation, first, it is determined whether or not a terminal connected to the other end of the first electric wire is identical to the second terminal ("B01") of the second electrical component (ECU) (first determination step: S203). As shown in FIG. 1(b), when it is determined that the other end of the first electric wire W1 is connected to the second terminal ("B01") of the second electrical component (ECU) in the same partitioned area 1 and is identical to the second terminal ("B01") of the second electrical component (ECU) described in the auxiliary device-based wiring information (S203:Y), it is regarded that the first terminal ("A01") of the first electrical component (ECU) described in the region-based connector/wiring information is electrically connected to the second terminal ("B01") of the second electrical component (ECU) (continuity success: S207). In this way, the success/failure determination step regarding the circuit line of FIG. 1(a) ends.

On the other hand, in the first determination step, there may be a case where the terminal connected to the other end of the first electric wire is not identical to the second terminal ("B01") of the second electrical component (ECU) (S203: N). In this case, the second electric wire having one end connected to the other end of the first electric wire described in the region-based connector/wiring information is specified on the basis of the wire harness information described in the region-based connector/wiring information with reference to the region-based connector/wiring information (second specification step: S204). The second specification step will be described in detail. For example, as shown in FIG. 1(c), an auxiliary device (in FIG. 1(c), a terminal "C01" is connected to the other end of the electric wire W1, and the terminal "C01" is accommodated in a connector C1) connected to the other end of the first electric wire W1 is specified from the information on a wire harness arranged in the partitioned area 1, an auxiliary device (a connector C2 in FIG. 1(c)) fitted to the connector C1 is specified from the information on a wire harness arranged in a partitioned area 2 adjacent to the partitioned area 1, and the second electric wire W2 having one end connected to a terminal "C02" connected to the terminal "C01" from among the terminals accommodated in the connector C2 is specified.

It is determined whether or not a terminal connected to the other end of the second electric wire is identical to the second terminal ("B01") of the second electrical component (ECU)

(second determination step: S205). As shown in FIG. 1(c), when it is determined that the other end of the second electric wire W2 is connected to the second terminal ("B01") of the second electrical component (ECU) in the partitioned area 2, and is identical to the second terminal ("B01") of the second electrical component (ECU) described in the auxiliary device-based wiring information (S205:Y), it is regarded that the first terminal ("A01") of the first electrical component (ECU) described in the region-based connector/wiring information is electrically connected to the second terminal ("B01") of the second electrical component (ECU) (continuity success: S207). In this way, the success/failure determination step regarding the circuit line of FIG. 1(a) ends.

However, in the second determination step, there may be a case where the terminal connected to the other end of the second electric wire is not identical to the second terminal ("B01") of the second electrical component (ECU). In this case, a third electric wire having one end connected to the other end of the second electric wire described in the region-based connector/wiring information is specified on the basis of the wire harness information described in the region-based connector/wiring information with reference to the region-based connector/wiring information (third specification step: S204). The third specification step will be described in detail. For example, as shown in FIG. 1(d), an auxiliary device (in FIG. 1(d), a terminal "C03" is connected to the other end of the electric wire W2, and the terminal "C03" is accommodated in a connector C3) connected to the other end of the second electric wire W2 is specified from the information on a wire harness arranged in the partitioned area 2, an auxiliary device (a connector C4 in FIG. 1(d)) fitted to the connector C3 is specified from the information on a wire harness arranged in a partitioned area 3 adjacent to the partitioned area 2, and a third electric wire W3 having one end connected to the terminal "C04" connected to the terminal "C03" from among the terminals accommodated in the connector C4 is specified.

It is determined whether or not a terminal connected to the other end of the third electric wire is identical to the second terminal ("B01") of the second electrical component (ECU) (third determination step: S205). As shown in FIG. 1(d), when it is determined that the other end of the third electric wire W3 is connected to the second terminal ("B01") of the second electrical component (ECU) in the partitioned area 3, and is identical to the second terminal ("B01") of the second electrical component (ECU) described in the auxiliary device-based wiring information, it is regarded that the first terminal ("A01") of the first electrical component (ECU) described in the region-based connector/wiring information is electrically connected to the second terminal ("B01") of the second electrical component (ECU) (continuity success: S207). In this way, the success/failure determination step regarding the circuit line of FIG. 1(a) ends.

In the third determination step (S205), when the terminal connected to the other end of the third electric wire is not identical to the second terminal ("B01") of the second electrical component (ECU), if the wire harness information described in the region-based connector/wiring information includes information on the fourth, fifth, . . . , and n-th electric wires W4, W5, . . . , and Wn, the fourth, fifth, . . . , and n-th specification steps (S204) and the fourth, fifth, . . . , and n-th determination steps (S205) are sequentially performed while incrementing n (S209) (where n is an integer of 2 or more).

On the other hand, when the information on the electric wire Wn connected to the electric wire W(n−1) is not present in the wire harness information described in the region-based connector/wiring information (S206: N; where n is an integer of 2 or more), and in the n-th specification step, it is not possible to specify the n-th electric wire Wn, such that the (n−1)th electric wire W(n−1) is not identical to the second terminal ("B01") of the second electrical component (ECU) described in the auxiliary device-based wiring information, it is regarded that the first terminal ("A01") of the first electrical component (ECU) described in the region-based connector/wiring information is not electrically connected to the second terminal ("B01") of the second electrical component (ECU) (continuity fail: S208). In this way, the success/failure determination step regarding the circuit line of FIG. 1(a) ends.

In FIGS. 1(a) to 1(d), an overview of a case where connectors of respective wire harnesses arranged in respective partitioned areas are connected together to form electric wires connected over a plurality of partitioned areas, and the terminals of two electrical components are connected by the electric wires has been mainly described. In addition to connecting the electric wires over a plurality of partitioned areas by a connector, there is a case where electric wires are connected through a JB or a JC (see FIG. 1(e)). There is also a case where a plurality of electric wires are connected in a single partitioned area (see FIG. 1(f)). These two cases will be described. First, a case where the electric wires are connected through a JB will be described. The first specification step (S202) and the first determination step (S203) are the same as those of the case where the electric wires are connected over a plurality of partitioned areas by a connector, and description thereof will not be repeated. The reasoning of the case where the electric wires are connected through a JC is the same as that of the case where the electric wires are connected through a JB, and description thereof will not be repeated.

A case where in the first determination step (S203), the terminal connected to the other end of the first electric wire is not identical to the second terminal ("B01") of the second electrical component (ECU) (S203: N) will be described. In this case, the second electric wire having one end connected to the other end of the first electric wire described in the region-based connector/wiring information is specified on the basis of the wire harness information described in the region-based connector/wiring information with reference to the region-based connector/wiring information (second specification step: S204). The second specification step will be described in detail. As shown in FIG. 1(e), an auxiliary device (in FIG. 1(e), a terminal "#01" is connected to the other end of the electric wire W1, and the terminal "#01" is accommodated in a connector Ca) connected to the other end of the first electric wire W1 is specified from the information on a wire harness arranged in the partitioned area 1, and a JB having a connector fitting position A fitted to the connector Ca is specified from a correspondence table. Connector fitting positions B and D connected to the connector fitting position A through an electric wire or a bus bar in the JB are specified, and second electric wires W21 and W22 having one set of ends connected to terminals "%01" and "#03" accommodated in respective connectors Cb and Cd to which the respective connector fitting positions B and D are fitted are specified.

It is determined whether or not a terminal connected to the other end of the second electric wire is identical to the second terminal ("B01") of the second electrical component (ECU) (second determination step: S205). As shown in FIG. 1(e), when it is determined that the other end of each of the second electric wires W21 and W22 is connected to the second terminal ("B01") of the second electrical component (ECU) in the partitioned area 2, and is identical to the second terminal ("B01") of the second electrical component (ECU) described in the auxiliary device-based wiring information, it is regarded that the first terminal ("A01") of the first electrical component (ECU) described in the region-based connector/wiring information is electrically connected to the second terminal ("B01") of the second electrical component (ECU) (continuity success: S207). In this way, the success/failure determination step regarding the circuit line of FIG. 1(e) ends.

When the electric wires are connected through a JB (or a JC), since a number of electric wires may be connected to a single electric wire, it is necessary to determine whether or not the other end of each of these electric wires is identical to the terminating point of the circuit line. This is different from a case where the electric wires are connected over a plurality of partitioned areas by a connector.

Subsequently, a case where a plurality of electric wires are connected in a single partitioned area will be described. The first specification step (S202) and the first determination step (S203) are the same as those of the case where the electric wires are connected over a plurality of partitioned areas by a connector, and description thereof will not be repeated.

A case where in the first determination step (S203), the terminal connected to the other end of the first electric wire is not identical to the second terminal ("B01") of the second electrical component (ECU) (S203: N) will be described. In this case, the second electric wire having one end connected to the other end of the first electric wire described in the region-based connector/wiring information is specified on the basis of the wire harness information described in the region-based connector/wiring information with reference to the region-based connector/wiring information (second specification step: S204). The second specification step will be described in detail. For example, as shown in FIG. 1(f), a connection point (in FIG. 1(f), the other end of the electric wire W1 is connected to one end of another electric wire, for example, through welding or butt-joining, and "%E1" is allocated as a number identifying the welding or butt-joining point) connected to the other end of the first electric wire W1 is specified from the information on a wire harness arranged in the partitioned area 1, and the second electric wire W2 having one end connected to the connection point "%E1" is specified.

It is determined whether or not the terminal connected to the other end of the second electric wire is identical to the second terminal ("B01") of the second electrical component (ECU) (second determination step: S205). As shown in FIG. 1(f), when it is determined that the other end of the second electric wire W2 is connected to the second terminal ("B01") of the second electrical component (ECU) in the partitioned area 1, and is identical to the second terminal ("B01") of the second electrical component (ECU) described in the auxiliary device-based wiring information, it is regarded that the first terminal ("A01") of the first electrical component (ECU) described in the region-based connector/wiring information is electrically connected to the second terminal ("B01") of the second electrical component (ECU) (continuity success: S207). In this way, the success/failure determination step regarding the circuit line of FIG. 1(f) ends.

Hereinabove, the processing of the success/failure determination step has been described. As described with reference to FIGS. 1(a) to 1(f), the starting point and the terminating point of the circuit line are specified with reference to the auxiliary device-based wiring information and it is recursively analyzed whether or not the other end of the first electric wire having one end connected to the starting point of the circuit line specified with reference to the region-based connector/wiring information or the other end of the n-th electric wire (where n is an integer of 2 or more) having one end connected to the other end of the (n−1)th electric wire is identical to the terminating point of the circuit line, or the n-th electric wire Wn is not present, such that the (n−1)th electric wire W(n−1) is not identical to the terminating point of the circuit line. As above, the processing for specifying the electric wires of the first electric wire W1, the second electric wire W2, . . . , and the N-th electric wire WN and the processing for determining whether or not the other end of each of these electric wires is identical to the terminating point of the circuit line will be collectively referred to as "multilayer inspection". During the "multilayer inspection", the processing for specifying the first electric wire W1 having one end connected to the starting point of the circuit line (first specification step: S202) and determining whether or not the other end of the electric wire W1 is identical to the terminating point of the circuit line (first determination step: S203) will be referred to as "single-layer inspection". The processing for specifying the n-th electric wire Wn (where n is an integer of 2 or more) (n-th specification step: S204) and determining whether or not the other end of the electric wire Wn is identical to the terminating point of the circuit line (n-th determination step: S205) will be referred to as "n-layer inspection" along with the processing of S206 and S209. For example, FIG. 1(b) shows a case where it is determined by single-layer inspection that the other end of the first electric wire W1 is identical to the terminating point of the circuit line. FIGS. 1(c), 1(e), and 1(f) show a case where it is determined by two-layer inspection that the other end of the second electric wire W2 (the second electric wire W22 in the case of FIG. 1(e)) is identical to the terminating point of the circuit line. FIG. 1(d) shows a case where it is determined by three-layer inspection that the other end of the third electric wire W3 is identical to the terminating point of the circuit line.

The success/failure determination step which is applicable to the wire harness continuity inspection method according to the embodiment of the present invention is not limited to that described in [Overview of Success/Failure Determination Step]. It should be noted that the success/failure determination step described in [Overview of Success/Failure Determination Step] is just an example.

[Combination Increase/Decrease Step]
[Object of Combination Increase/Decrease Step]

As described in [Overview of Success/Failure Determination Step], in the success/failure determination step, the presence/absence of continuity is inspected using a batch of auxiliary device-based wiring information (a batch of auxiliary device-based wiring information has a plurality of pieces of auxiliary device-based wiring information which are respectively designated for the systems, such as a head lamp system, an airbag system, an air-conditioning system, an engine control system, and an antilock brake system, to be separately driven) referenced in the reference step S201 and a batch of region-based connector/wiring information (a batch of region-based connector/wiring information has a plurality of pieces of region-based connector/wiring information in which one wire harness is designated in each partitioned area) referenced in the first determination step S202 and the second determination step S204.

At this time, as described in [Technical Problem], when there are a plurality of candidates for a wire harness arrangeable in a certain partitioned area. It is necessary that one of the candidates creates a batch of region-based connector/wiring information arranged in the partitioned area, and the success/failure determination step is executed on each piece of region-based connector/wiring information. For example, when the number of candidates for a wire harness arrangeable in a partitioned area A is three of A-1, A-2, and A-3, it is necessary that one of the candidates A-1, A-2, and A-3 for the wire harness creates a batch of region-based connector/wiring information designated as the wire harness arranged in the partitioned area A by three pieces in total, and the success/failure determination step is executed on each piece of region-based connector/wiring information. For example, when the number of candidates for a wire harness arrangeable in the partitioned area A is three of A-1, A-2, and A-3, and candidates for a wire harness arrangeable in a partitioned area B are three of B-1, B-2, and B-3, it is necessary that one of the candidates A-1, A-2, and A-3 for the wire harness arrangeable in the partitioned area A and one of the candidates B-1, B-2, and B-3 for the wire harness arrangeable in the partitioned area B create a batch of region-based connector/wiring information designated as the wire harness arranged in the partitioned area A and the partitioned area B by nine pieces (3×3) in total, and the success/failure determination step is executed on each piece of region-based connector/wiring information. In summary, when the number of candidates for an arrangeable wire harness in the partitioned area A is a, and the number of candidates for an arrangeable wire harness in the partitioned area B is b, and the number of candidates for an arrangeable wire harness in a partitioned area C is c, . . . , it is necessary that a batch of region-based connector/wiring information is created by the number (a×b×c× . . . ) of combinations, and the success/failure determination step is executed on each piece of region-based connector/wiring information. The number of combinations depends on a vehicle, and may be equal to or greater than 100,000.

However, as the number of candidates for a wire harness arrangeable in a partitioned area increases, a batch of region-based connector/wiring information increases. As a result, it takes a lot of time to perform the success/failure determination step which is executed on each piece of a batch of region-based connector/wiring information. A case where the number of patterns of region-based connector/wiring information to be created is narrowed down to shorten the time required for the success/failure determination step is considered. However, the accuracy of the success/failure determination step is lowered depending on the narrowing method. In this way, the time required for the success/failure determination step and the accuracy of the success/failure determination step have a trade-off relationship, and considering that the time and the accuracy can be optimized, it is preferable that region-based connector/wiring information to be created can be determined, and the number of patterns of the region-based connector/wiring information can increase or decrease.

The object of a combination increase/decrease step which will be described below is to determine region-based connector/wiring information to be created and to increase or decrease the number of patterns of the region-based connector/wiring information so as to optimize the time required for the success/failure determination step and the accuracy of the success/failure determination step. Hereinafter, first, a combination narrowing step of narrowing down the number of pieces of region-based connector/wiring information to be created, that is, a method of decreasing the number of pieces of region-based connector/wiring information to be created will be described, and then, a combination addition step of adding region-based connector/wiring information to be created, that is, a method of increasing the number of pieces of region-based connector/wiring information to be created will be described.

[Combination Narrowing Step]
[Overview of Combination Narrowing Step]

An overview of a combination narrowing step will be described with reference to diagrams for explaining the presence/absence of connections in partitioned areas in the wire harness continuity inspection method according to the embodiment of the present invention shown in FIGS. 3(a) and 3(b).

FIGS. 3(a) and 3(b) show a state where the vehicle space is partitioned into three areas of partitioned areas A, B, and C. It is assumed that the vehicle space of a vehicle model is specified depending on the presence/absence of a grade and an optional function. If a vehicle model is specified, the systems, such as a head lamp system, an airbag system, an air-conditioning system, an engine control system, and an antilock brake system, which are mounted in a vehicle and separately driven are specified. In this description, a set of systems which should be clearly satisfied in a certain vehicle is defined as "specification", and information for identifying an individual system constituting the set is referred to as "specification code".

FIG. 3(a) assumes a vehicle A in which a head lamp system (represented by a specification code "HLS"), an airbag system (represented by a specification code "AiBS"), an air-conditioning system (represented by a specification code "ACS"), an engine control system (represented by a specification code "ECS"), and an antilock brake system (represented by a specification code "AnBS") are satisfied as specifications. FIG. 3(b) assumes a vehicle B in which a head lamp system (represented by a specification code "HLS"), an airbag system (represented by a specification code "AiBS"), an air-conditioning system (represented by a specification code "ACS"), an engine control system (represented by a specification code "ECS"), and an antilock brake system (represented by a specification code "AnBS") are satisfied as specifications. It is assumed that the vehicle A and the vehicle B are the same vehicle, and are vehicle models in which the presence/absence of a grade and an optional function is different.

In a vehicle in which the vehicle space is partitioned into a plurality of partitioned areas, a specification code is allocated to each partitioned area where a wire harness for driving a system identified by the specification code should be arranged. For example, in the vehicle shown in FIG. 3(a), a specification code identifying a head lamp system is allocated to the partitioned areas A and B, a specification code identifying an airbag system is allocated to the partitioned areas B and C, a specification code identifying an air-conditioning system is allocated to the partitioned areas A, B, and C, a specification code identifying an engine control system is allocated to the partitioned areas A and B, and a specification code identifying an antilock brake system is allocated to the partitioned areas A, B, and C. For example, in the vehicle B shown in FIG. 3(b), a specification code identifying a head lamp system is allocated to the partitioned areas A and B, a specification code identifying an airbag system is allocated to the partitioned areas B and C, a specification code identifying an air-conditioning system is allocated to the partitioned areas B and C, a specification code identifying an engine control system is allocated to the partitioned areas A and B, and a specification code identifying an antilock brake system is allocated to the partitioned areas B and C.

Subsequently, the above-described specification codes are given for the respective partitioned areas. In the vehicle A shown in FIG. 3(a), four specification codes "HLS", "ACS", "ECS", and "AnBS" in total are allocated to the partitioned area A, five specification code "HLS", "AiBS", "ACS", "ECS", and "AnBS" in total are allocated to the partitioned area B, and three specification codes "AiBS", "ACS", and "AnBS" in total are allocated to the partitioned area C. In the vehicle B shown in FIG. 3(b), two specification codes "HLS" and "ECS" in total are allocated to the partitioned area A, five specification codes "HLS", "AiBS", "ACS", "ECS", and "AnBS" are allocated to the partitioned area B, and three specification codes "AiBS", "ACS", and "AnBS" in total are allocated to the partitioned area C.

In this way, the number of specification codes allocated to each partitioned area differs between the partitioned areas. In a partitioned area to which a number of specification codes are allocated, there are many electric wires in the partitioned area. Accordingly, it can be said that the number of connection points of electric wires between a wire harness arrangeable in the partitioned area and a wire harness arrangeable in another partitioned area is large, and there is a significant need for executing continuity inspection of these wire harnesses. Meanwhile, the number of electric wires in a partitioned area to which a small number of specification codes are allocated is small. Accordingly, it can be said that the number of connection points of electric wires between a wire harness arrangeable in the partitioned area and a wire harness arrangeable in another partitioned area is small, and there is a little need for executing continuity inspection of a wire harness arrangeable in the partitioned area.

The relationship of the specification codes is given focusing on two partitioned areas. In the vehicle A shown in FIG. 3(a), the specification codes "HLS", "ACS", "ECS", and "AnBS" are shared by the partitioned area A and the partitioned area B, the specification codes "AiBS", "ACS", and "AnBS" are shared by the partitioned area B and the partitioned area C, and the specification codes "ACS" and "AnBS" are shared by the partitioned area C and the partitioned area A. In the correspondence table on the upper right side of FIG. 3(a), it is represented that a plurality of partitioned areas marked with "O" for a certain specification code share the specification code. In this way, when at least one specification code is shared by a certain partitioned area X and another partitioned area Y, hereinafter, it is regarded that "there is a connection between the partitioned areas X and Y". When this happens, in the vehicle A shown in FIG. 3(a), it can be said that there are connections between the partitioned area A and the partitioned area B, between the partitioned area B and the partitioned area C, and between the partitioned area C and the partitioned area A. In the correspondence table on the lower right side of FIG. 3(a), it is represented that there is a connection between partitioned areas marked with "O" from among the combinations of two partitioned areas selected from the partitioned areas A, B, and C.

In the vehicle B shown in FIG. 3(b), the specification codes "HLS" and "ECS" are shared by the partitioned area A and the partitioned area B, and the specification codes "AiBS", "ACS", and "AnBS" are shared by the partitioned area B and the partitioned area C. There is no specification code shared by the partitioned area C and the partitioned area A. In the correspondence table on the upper right side of FIG. 3(b), it is represented that a plurality of partitioned areas marked with "O" for a certain specification code share the specification code. When this happens, in the vehicle B shown in FIG. 3(b), it can be said that there are connections between the partitioned area A and the partitioned area B and between the partitioned area B and the partitioned area C. Meanwhile, unlike the vehicle A shown in FIG. 3(a), there is no connection between the partitioned area C and the partitioned area A. In the correspondence table on the lower right side of FIG. 3(b), it is represented that there is a connection between partitioned areas marked with "O" from among the combinations of two partitioned areas selected from the partitioned areas A, B, and C, and there is no connection between partitioned areas marked with "-".

In the combination narrowing step of the wire harness continuity inspection method according to the embodiment of the present invention, the number of patterns to be created of a batch of region-based connector/wiring information subjected to the success/failure determination step efficiently decreases on the basis of the number of specification codes allocated to partitioned areas and the presence/absence of connection between two partitioned areas.

[Details of Combination Narrowing Step]

The details of the combination narrowing step will be described with reference to a conceptual diagram of the number of patterns to be created of region-based connector/wiring information, on which the success/failure determination step should be executed, in the wire harness continuity inspection method according to the embodiment of the present invention shown in FIG. 4. The conceptual diagram of FIG. 4 corresponds to the vehicle A shown in FIG. 3(a).

Figure 4:
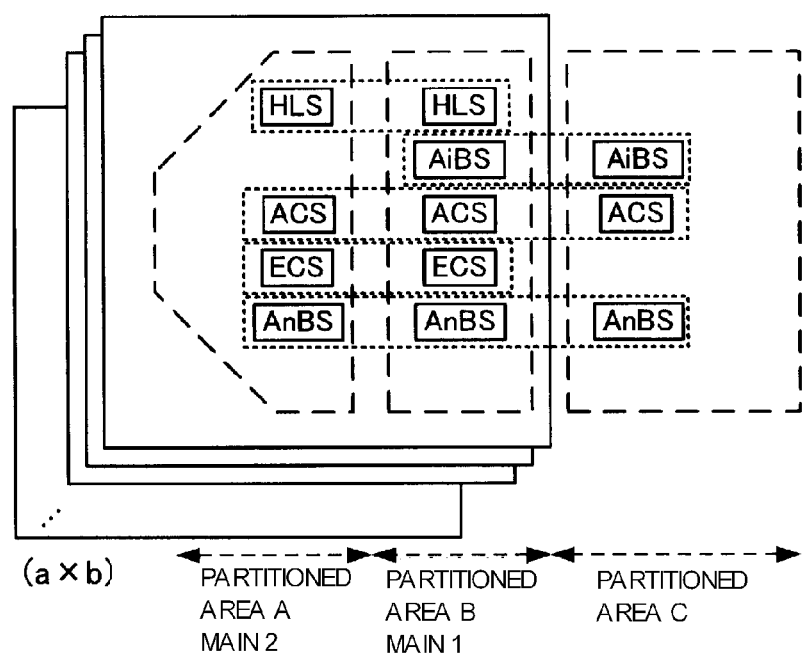
FIG. 4 is a conceptual diagram (corresponding to a vehicle A) of the number of patterns to be created of all pieces of region-based connector/wiring information, on which a success/failure determination step should be executed, in a wire harness continuity inspection method according to an embodiment of the present invention.

As shown in FIG. 4, the number of specification codes allocated to each of the partitioned areas A, B, and C of the vehicle A shown in FIG. 3(a) is four in the partitioned area A, five in the partitioned area B, and three in the partitioned area C. First, a partitioned area to which the largest number of specification codes are allocated is specified (this partitioned area is hereinafter referred to as Main 1). In the vehicle A shown in FIG. 3(a), it is understood that the partitioned area B is Main 1. In the vehicle A, Main 1 specified in this way is a partitioned area to which the largest number of specification codes are allocated. For this reason, it can be said that Main 1 is a partitioned area having the largest number of connections to other partitioned areas.

Subsequently, of the partitioned areas having connections to Main 1 (the partitioned area B), a partitioned area to which the largest number of specification codes are allocated is specified (this partitioned area is hereinafter referred to as Main 2). In the vehicle A shown in FIG. 3(a), partitioned areas having connections to Main 1 are the partitioned areas A and C, and of the partitioned areas A and C, a partitioned area to which a larger number of specification codes are allocated is the partitioned area A. For this reason, it is understood that the partitioned area A is Main 2. In the vehicle A, Main 2 specified in this way is a partitioned area which shares the largest number of specification codes with Main 1. For this reason, it can be said that, of the partitioned areas having connections to Main 1, this connection is deepest.

In the vehicle A, since a wire harness arrangeable in Main 1 and Main 2 specified in this way have the largest number of connection points of electric wires, it can be said that it is most necessary to execute continuity inspection of these wire harnesses. On the contrary, in the vehicle A, since a wire harness arrangeable in Main 1 and the partitioned area C and a wire harness arrangeable in Main 2 and the partitioned area C have a smaller number of connection points of electric wires than the wire harness arrangeable in Main 1 and Main 2, it can be said that there is a little need for executing continuity inspection of these wire harnesses.

In the wire harness continuity inspection method according to the embodiment of the present invention, when the number of candidates for an arrangeable wire harness is a in the partitioned area A, b in the partitioned area B, and c in the partitioned area C, all candidates for a wire harness arrangeable in a partitioned area corresponding to neither Main 1 nor Main 2 are not to be described in region-based connector/wiring information, the patterns of a batch of region-based connector/wiring information in which one of candidates for a wire harness is designated for Main 1 (the partitioned area B) and Main 2 (the partitioned area A) are created by (a×b) in total, and the success/failure determination step is executed on each of the (a×b) pieces of region-based connector/wiring information. In regard to a partitioned area corresponding to neither Main 1 nor Main 2, any of candidates for a wire harness arrangeable in the partitioned area is to be described in region-based connector/wiring information. Even in this way, the number of patterns to be created of a batch of region-based connector/wiring information is (a×b).

Figure 5:
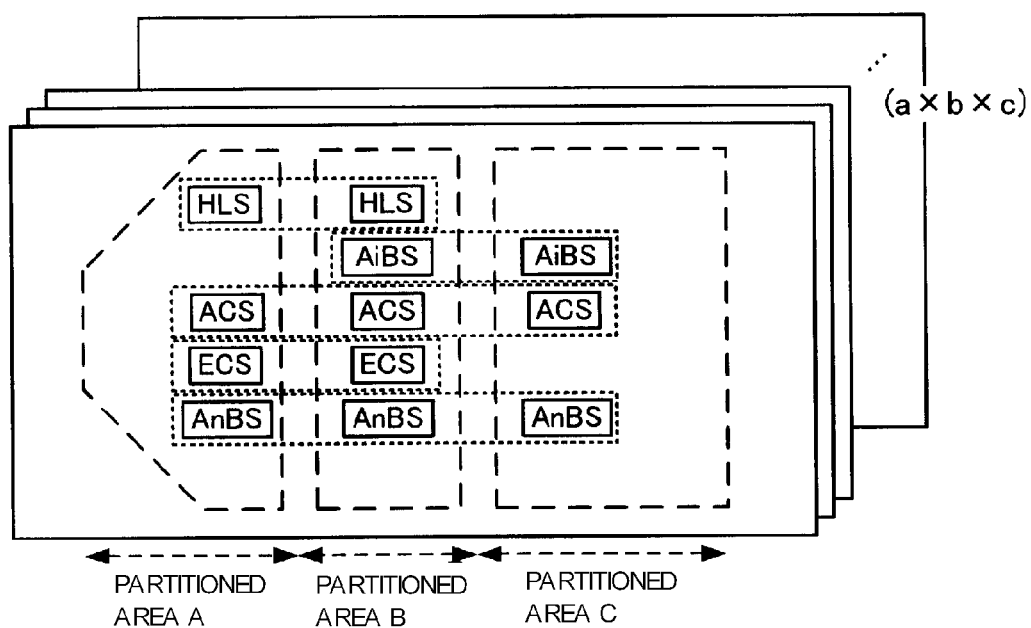
FIG. 5 is a conceptual diagram (corresponding to a vehicle A) of the number of patterns to be created of all pieces of region-based connector/wiring information, on which a success/failure determination step should be executed, in the related art.

In the method of the related art, it is necessary to create a batch of region-based connector/wiring information in which one wire harness is designated for each of the partitioned areas A, B, and C. As a result, like a conceptual diagram of the number of patterns to be created of region-based connector/wiring information, on which the success/failure determination step should be executed, in the related art shown in FIG. 5, when the number of candidates for an arrangeable wire harness in the partitioned area A is a, the number of candidates for an arrangeable wire harness in the partitioned area B is b, and the number of candidates for an arrangeable wire harness in the partitioned area C is c, it is necessary that a batch of region-based connector/wiring information is created by the number (a×b×c) of combinations, and the success/failure determination step is executed on each of (a×b×c) pieces of region-based connector/wiring information.

In the wire harness continuity inspection method according to the embodiment of the present invention, when the number of candidates for an arrangeable wire harness is a in the partitioned area A, b in the partitioned area B, c in the partitioned area C, . . . , a batch of region-based connector/wiring information designated for every two narrowed partitioned areas (in FIG. 4, the partitioned areas are narrowed down to the partitioned areas A and B.) is created by (a×b) pieces, and the success/failure determination step is executed on each of the (a×b) pieces of region-based connector/wiring information. The [(a×b×c)−(a×b)] pieces of region-based connector/wiring information is not done compared to the method of the related art, thereby shortening the time required for the success/failure determination step on [(a×b×c)−(a×b)] pieces of region-based connector/wiring information.

For ease of understanding of the wire harness continuity inspection method according to the embodiment of the present invention, the combination narrowing step will be described with reference to a conceptual diagram of the number of patterns to be created of region-based connector/wiring information, on which the success/failure determination step should be executed, in the wire harness continuity inspection method according to the embodiment of the present invention shown in FIG. 6. The conceptual diagram of FIG. 6 corresponds to the vehicle B shown in FIG. 3(*b*).

Figure 6:
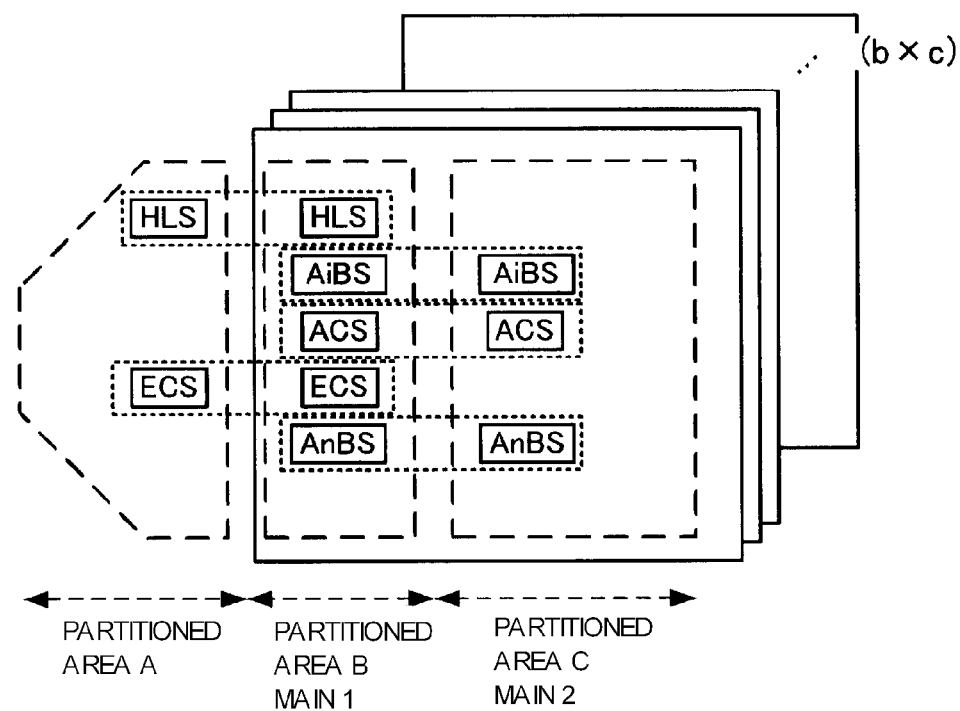
FIG. 6 is a conceptual diagram (corresponding to a vehicle B) of the number of patterns to be created of all pieces of region-based connector/wiring information, on which a success/failure determination step should be executed, in a wire harness continuity inspection method according to an embodiment of the present invention.

As shown in FIG. 6, the number of specification codes allocated to each of the partitioned areas A, B, and C of the vehicle A shown in FIG. 3(*b*) is two in the partitioned area A, five in the partitioned area B, and three in the partitioned area C. First, a partitioned area to which the largest number of specification codes are allocated is specified. In the vehicle B shown in FIG. 3(*b*), it is understood that the partitioned area B is Main 1.

Subsequently, of the partitioned areas having connections to Main 1 (the partitioned area B), a partitioned area to which the largest number of specification codes are allocated is specified. In the vehicle B shown in FIG. 3(*b*), the partitioned areas having connections to Main 1 are the partitioned areas A and C, and of the partitioned areas A and C, a partitioned area to which a larger number of specification codes are allocated is the partitioned area C. For this reason, it is understood that the partitioned area C is Main 2.

In the vehicle B, since a wire harness arrangeable in Main 1 and Main 2 specified in this way has the largest number of connection points of electric wires, it can be said that it is most necessary to execute continuity inspection of these wire harnesses. On the contrary, in the vehicle B, since a wire harness arrangeable in Main 1 and the partitioned area A and a wire harness arrangeable in Main 2 and the partitioned area A have a smaller number of connection points of electric wires than the wire harness arrangeable in Main 1 and Main 2, it can be said that there is a little need for executing continuity inspection of these wire harnesses.

In the wire harness continuity inspection method according to the embodiment of the present invention, when the number of candidates for an arrangeable wire harness is a in the partitioned area A, b in the partitioned area B, and c in the partitioned area C, all candidates for a wire harness arrangeable in a partitioned area corresponding to neither Main 1 nor Main 2 are not to be described in region-based connector/wiring information, the patterns of a batch of region-based connector/wiring information in which one of candidates for a wire harness is designated for Main 1 (the partitioned area B) and Main 2 (the partitioned area C) are created by (b×c) in total, and the success/failure determination step is executed on each of the (b×c) pieces of region-based connector/wiring information. The creation of [(a×b×b×c)−(b×c)] pieces of region-based connector/wiring information is not done compared to the method of the related art, thereby shortening the time required for the success/failure determination step on the [(a×b×b×c)−(b×c)] pieces of region-based connector/wiring information.

As above, with the wire harness continuity inspection method according to the embodiment of the present invention, it is possible to decrease the number of patterns to be created of the region-based connector/wiring information compared to the method of the related art, thereby shortening the time required for the success/failure determination step.

When specifying Main 1, a case where the number of specification codes is the same in a plurality of partitioned areas is considered. In this case, it is necessary to select one from among a plurality of partitioned areas in which the number of specification codes is the same. At this time, for example, the number of candidates for a wire harness arrangeable in each of a plurality of partitioned areas is compared, and a partitioned area having the largest number of candidates is specified as Main 1. Similarly, when specifying Main 2, a case where the number of specification codes is the same in a plurality of partitioned areas is considered. In this case, for example, the number of candidates for a wire harness arrangeable in each of a plurality of partitioned areas is compared, and a partitioned area having the largest number of candidates is specified as Main 2, or the number of specification codes shared by each of a plurality of partitioned areas and Main 1 is compared, and a partitioned area having the largest number of shared specification codes is specified as Main 2.

[Combination Addition Step]

Next, the details of a combination addition step will be described.

[Example of Combination Addition Step]

In [Combination Narrowing Step] described above, the combination narrowing step of narrowing down the number of patterns of the region-based connector/wiring information to be created has been described. However, only with the combination narrowing step, while the success/failure determination step can be executed on the combination of wire harnesses arranged between Main 1 and Main 2 with the highest priority for continuity inspection, the success/failure determination step may not be executed on the combination of wire harnesses arranged other two partitioned areas. For this reason, when a key electric wire in driving a certain system is connected through wire harnesses arranged two partitioned areas other than Main 1 and Main 2, continuity inspection on the electric wire is not executed. In regard to a wire harness including a key electric wire in driving a certain system, even if the wire harness is not arranged in Main 1 and Main 2, addition to the patterns of the region-based connector/wiring information to be created should be done, and the success/failure determination step should be executed on the region-based connector/wiring information. Hereinafter, an example of a combination addition step of increasing the patterns of a batch of region-based connector/wiring information will be described. Although in [Example of Combination Addition Step], a case where an additional pattern is added to the region-based connector/wiring information in which the patterns are narrowed down in [Combination Narrowing Step] described above has been described, [Example of Combination Addition Step] of the present invention is not a method which may only be applied to the region-based connector/wiring information in which the patterns are narrowed down in [Combination Narrowing Step] described above, an additional pattern may be added to the patterns of region-based connector/wiring information decreased by a method other than [Combination Narrowing Step] described above.

The procedure for specifying Main 1 and Main 2 is as described in [Combination Narrowing Step], thus description thereof will not be repeated. Hereinafter, as shown in FIG. 4, a case where the partitioned area B is specified as Main 1, and the partitioned area A is specified as Main 2 will be described.

Subsequently, any partitioned area is selected from the partitioned areas other than Main 1 and Main 2, and any wire harness for continuity inspection is selected from wire harnesses arrangeable in the partitioned area. It is assumed that the partitioned area C is selected from the partitioned areas other than Main 1 and Main 2. It is also assumed that the number of candidates for a wire harness arrangeable in the partitioned area A as Main 2 is three of A-1, A-2, and A-3, the number of candidates for a wire harness arrangeable in the partitioned area B as Main 1 is three of B-1, B-2, and B-3, the number of candidates for a wire harness arrangeable in the partitioned area C is three of C-1, C-2, and C-3, and a wire harness C-1 for continuity inspection is selected from the wire harnesses C-1, C-2, and C-3 arrangeable in the partitioned area C as any wire harness.

When the above-described wire harness C-1 is specified as an additional pattern should be newly added to the patterns of the region-based connector/wiring information, as shown in a diagram for explaining an example of the relationship of need for creation of region-based connector/wiring information of FIG. 7, a batch of region-based connector/wiring information is created as patterns. That is, nine pieces of region-based connector/wiring information designated with the following wire harnesses as the wire harnesses arranged in the partitioned areas A, B, and C are created.

Combination No. 1 (A-1,B-1,C-1)
Combination No. 4 (A-1,B-2,C-1)
Combination No. 7 (A-1,B-3,C-1)
Combination No. 10 (A-2,B-1,C-1)
Combination No. 13 (A-2,B-2,C-1)
Combination No. 16 (A-2,B-3,C-1)
Combination No. 19 (A-3,B-1,C-1)
Combination No. 22 (A-3,B-2,C-1)
Combination No. 25 (A-3,B-3,C-1)

The combinations No. 1, 4, 7, 10, 13, 16, 19, 22, and 25 correspond to the combinations of the wire harnesses A-1, A-2, and A-3 and the wire harnesses B-1, B-2, and B-3. In this way, through the combination narrowing step, in regard to a batch of region-based connector/wiring information in which a wire harness is designated for Main 1 and Main 2, the wire harness C-1 from among the candidates for a wire harness arrangeable in the partitioned area C is added to the combinations, and the result is created as a batch of region-based connector/wiring information. Accordingly, the region-based connector/wiring information in which a wire harness for continuity inspection is designated is created through the combination addition step, thereby improving the accuracy of the success/failure determination step.

Although a case where any partitioned area is selected from the partitioned areas other than Main 1 and Main 2 has been described, of the partitioned areas having connections to Main 1 and Main 2 from among the partitioned areas excluding Main 1 and Main 2, a partitioned area to which the largest number of specification codes are allocated may be selected. The partitioned area (referred to as Sub) specified in this way is a partitioned area in which the largest number of specification codes are shared by Main 1 and Main 2. For this reason, it can be said that, from among the partitioned areas having connections to both of Main 1 and Main 2, this connection is deepest. That is, this means that, since wire harnesses arrangeable in Main 1-Sub and Main 2-Sub have a large number of connection points of electric wires, there is a significant need for executing continuity inspection of these wire harnesses. Accordingly, the selection of a partitioned area in this way contributes to improving the accuracy of the success/failure determination step.

Although a case where any wire harness is selected from wire harnesses arrangeable in the selected partitioned area has been described, when systems which can be driven by these wire harnesses are known, it is preferable to select a wire harness on the basis of the number of systems which can be driven, the priority of the systems, or the like.

[Another Example of Combination Addition Step]

Hereinafter, another example of the combination addition step of increasing the number of patterns of a batch of region-based connector/wiring information will be described with reference to a diagram for explaining the relationship of need for creation of region-based connector/wiring information of FIG. 8. In FIG. 8, all combinations (3×3×3) of a batch of region-based connector/wiring information when the number of candidates for a wire harness arrangeable in the partitioned area A is three of A-1, A-2, and A-3, the number of candidates for a wire harness arrangeable in the partitioned area B is three of B-1, B-2, and B-3, and the number of candidates for a wire harness arrangeable in the partitioned area C is three of C-1, C-2, and C-3 are described.

If a wire harness arranged in each partitioned area is selected, specifications satisfied by a vehicle when the wire harness is connected can be specified. For example, in Combination No. 1 of FIG. 8, when A-1 is selected as a wire harness arranged in the partitioned area A, B-1 is selected as a wire harness arranged in the partitioned area B, and C-1 is selected as a wire harness arranged in the partitioned area C, a vehicle in which these wire harnesses are arranged and connected together fulfills the specifications of "HLS", "AiBS", "ACS", "ECS", and "AnBS". Similarly, in Combination No. 4 of FIG. 8, when A-1 is selected as a wire harness arranged in the partitioned area A, B-2 is selected as a wire harness arranged in the partitioned area B, and C-1 is selected as a wire harness arranged in the partitioned area C, a vehicle in which these wire harnesses are arranged and connected together fulfills the specifications of "HLS", "AiBS", "ACS", and "ECS". In this way, in regard to all of Combinations No. 1 to No. 27 of FIG. 8, the specifications satisfied by a vehicle, in which these wire harnesses are arranged and connected together, can be specified. The reason for specifying the specifications satisfied by a vehicle in this way is that, when a wire harness arranged in each partitioned area is specified, as a result, connections between electrical components arranged in each partitioned area are specified, and the drivability of the electrical components and consequently, the drivability of the system can be determined. If it can be determined that a system can be driven, the specification codes of the specifications satisfied by the vehicle can be specified.

In Combinations No. 18 and 24 of FIG. 8, there is no specification satisfied by a vehicle in which these wire harnesses are arranged and connected together. While there is no specification satisfied by a vehicle in the combinations of a batch of region-based connector/wiring information, the success/failure determination step on a batch of region-based connector/wiring information having the combinations should not be executed from the viewpoint of shortening the time required for the success/failure determination step. In Combination Nos. 1, 3, 8, 12, 13, 16, 21, and 25 of FIG. 8, the number of specifications satisfied by a vehicle, in which these wire harnesses are arranged and connected together is maximum five of "HLS", "AiBS", "ACS", "ECS", and "AnBS" in total. While there are all of the specifications satisfied by a vehicle in the combinations of a batch of region-based connector/wiring information, the success/failure determination step of a batch of region-based connector/wiring information having the combinations should be executed from the viewpoint of improving the accuracy of the success/failure determination step.

For this reason, the patterns of a batch of region-based connector/wiring information to be created are determined on the basis of specification codes specified when a wire harness arranged in each partitioned area is designated. In FIG. 8, of Combination No. 1 to No. 27, Combination Nos. 1, 3, 8, 12, 13, 16, 21, and 25 having the largest number of specifications satisfied by a vehicle are put for a batch of region-based connector/wiring information to be created.

After the patterns of region-based connector/wiring information in [Combination Narrowing Step] described above are narrowed down, when an additional pattern is added to the region-based connector/wiring information in [Another Example of Combination Addition Step], the patterns of the region-based connector/wiring information are narrowed down to Combination Nos. 1, 4, 7, 10, 13, 16, 19, 22, and 25 in [Combination Narrowing Step], and Nos. 3, 8, 12, and 21 are added to the patterns of the region-based connector/wiring information in [Another Example of Combination Addition Step]. As a result, a batch of region-based connector/wiring information is created by 13 pieces of Nos. 1, 3, 4, 7, 8, 10, 12, 13, 16, 19, 21, 22, and 25 in total.

Although a case where Nos. 1, 3, 8, 12, 13, 16, 21, and 25 having the largest number of specifications satisfied by a vehicle are put for a batch of region-based connector/wiring information to be created, the present invention is not limited to the condition that the number of specification satisfied by a vehicle is largest. For example, combination for a batch of region-based connector/wiring information to be created may be selected under the condition that any specification for securing vehicle safety is included. In summary, the patterns of a batch of region-based connector/wiring information to be created may be determined on the basis of specification codes when a wire harness arranged in each partitioned area is designated.

Although a case where an additional pattern is added to the region-based connector/wiring information in [Another Example of Combination Addition Step] after the patterns of the region-based connector/wiring information are narrowed down in [Combination Narrowing Step] has been described, the patterns of the region-based connector/wiring information may be determined only through [Another Example of Combination Addition Step] without passing through [Combination Narrowing Step]. that is, this indicates that [Another Example of Combination Addition Step] may become an embodiment of the combination narrowing step.

As above, with the wire harness continuity inspection method according to the embodiment of the present invention, region-based connector/wiring information to be created is narrowed down through the combination narrowing step, thereby shortening the time required for the success/failure determination step. And, region-based connector/wiring information in which a wire harness having high priority for continuity inspection is created through the combination addition step, thereby improving the accuracy of the success/failure determination step. As a result, it is possible to achieve the optimization of the success/failure determination step and the accuracy of the success/failure determination step.

Figure 9:
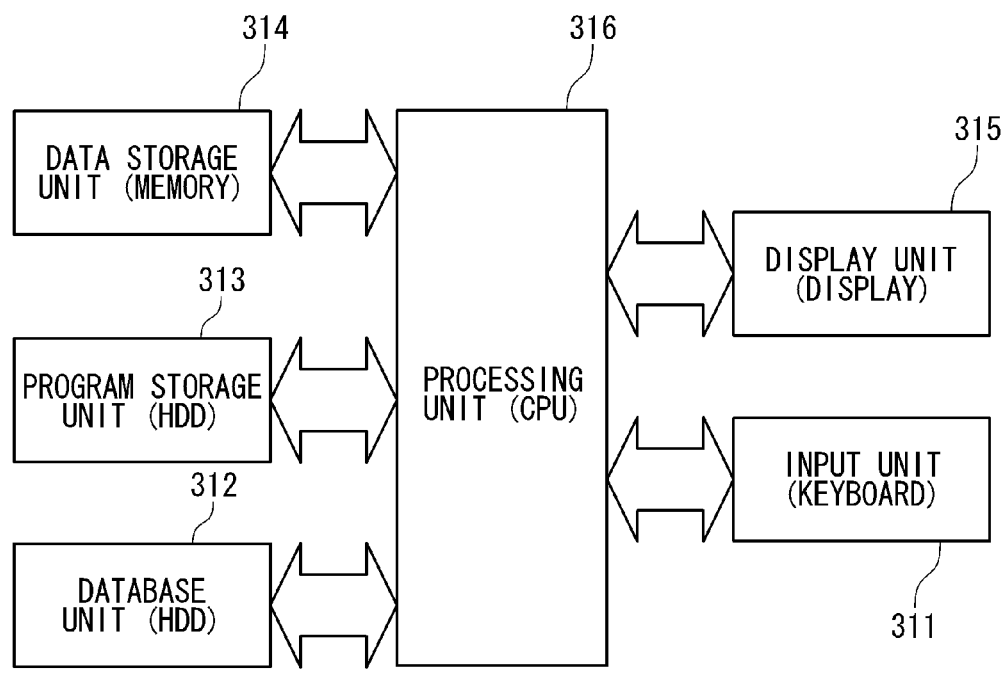
FIG. 9 is a functional block diagram of a wire harness continuity inspection device according to an embodiment of the present invention.

Hereinafter, the configuration of a wire harness continuity inspection device according to the embodiment of the present invention will be described. First, the configuration of the wire harness continuity inspection device according to the embodiment of the present invention will be described with reference to a functional block diagram of the wire harness continuity inspection device according to the embodiment of the present invention shown in FIG. 9.

[Configuration of Wire Harness Continuity Inspection Device]

The wire harness continuity inspection device according to the embodiment of the present invention includes an input unit 311, a database unit 312, a program storage unit 313, a data storage unit 314, a display unit 315, and a processing unit 316. When the wire harness continuity inspection device of the present invention is configured by a general-purpose PC, for example, the input unit 311 is realized by various input interfaces, such as a keyboard, a mouse, or a number pad. The database unit 312 and the program storage unit 313 are realized by a hard disk drive (HDD), the data storage unit 314 is realized by a RAM (Random Access Memory), the display unit 315 is realized by various output devices, such as a CRT display or a liquid crystal display, and the processing unit 316 is realized by a CPU (Central Processing Unit). Data of the auxiliary device-based wiring information, data of the region-based connector/wiring information (if necessary, data of the actual wiring diagram created on the basis of the auxiliary device-based wiring information), and data of the auxiliary device specification table are stored in the database unit 312. A program which causes the processing unit 316 to execute the multilayer inspection and the combination increase/decrease step (the combination narrowing step and the combination addition step) are recorded in the program storage unit 313. Data input and output to and from the processing unit 316 executing the multilayer inspection and the combination increase/decrease step (the combination narrowing step and the combination addition step) are recorded in the data storage unit 314. A person who instructs the wire harness continuity inspection device of the present invention to execute the multilayer inspection and the combination increase/decrease step (the combination narrowing step and the combination addition step) performs various operations for allowing the processing unit 316 to perform computation using the input unit 311 while viewing the display unit 315.

While the present invention has been described in detail with reference to specific embodiments, it is obvious to those skilled in the art that various changes and modifications can be made without departing from the spirit and scope of the present invention.

This application is based on Japanese Patent Application No. 2010-123349, filed on May 28, 2010, the entire content of which is incorporated herein by reference.

INDUSTRIAL APPLICABILITY

According to the wire harness continuity inspection method and the wire harness continuity inspection program of the present invention, it is possible to optimize the time required for a success/failure determination step and the accuracy of the success/failure determination step by determining region-based connector/wiring information to be created and increasing or decreasing the number of patterns of the region-based connector/wiring information.

REFERENCE SIGNS LIST

311: input unit
312: database unit
313: program storage unit
314: data storage unit
315: display unit
316: processing unit

The invention claimed is:

1. A wire harness conductivity inspection method comprising:
   a reference step of referencing specifications satisfied by a vehicle in which a wire harness is arranged in each partitioned area of a plurality of partitioned areas of a vehicle space, wherein the specifications respectively indicate different systems of the vehicle; and
   a creation step of creating, for each partitioned area, region-based connector/wiring information described for a wire harness arranged in the partitioned area, wherein the region-based connector/wiring information includes specifications of the different systems in the partitioned area; and
   an inspection step of inspecting presence/absence of an error in a connection of electric wires in the created region-based connector/wiring information;
   wherein the region-based connector/wiring information of each partitioned area of the plurality of partitioned areas includes at least one common specification indicating at least one common system, and
   wherein the above steps are carried out by a processing unit.

2. A wire harness conductivity inspection program which, when executed by a computer, causes the computer to execute the steps of the wire harness conductivity inspection method according to claim 1.

3. The wire harness conductivity inspection method according to claim 1, wherein the inspection step is not performed for a partitioned area with the least number of specifications indicating systems.

4. A wire harness conductivity inspection method comprising:
   a first specification step of specifying a predetermined first partitioned area from among partitioned areas into which a vehicle space is partitioned; and
   a creation step of creating region-based connector/wiring information described for at least a predetermined wire harness from among first wire harnesses arrangeable in the first partitioned area, wherein the region-based connector/wiring information includes specifications of different systems in the first partitioned area;
   wherein the above steps are carried out by a processing unit.

5. The wire harness conductivity inspection method according to claim 4, wherein the predetermined first partitioned area contains the greatest number of the specifications indicating systems from among the partitioned areas.

6. The wire harness conductivity inspection method according to claim 4, further comprising a second specification step of specifying a predetermined second partitioned area from among partitioned areas into which a vehicle space is partitioned, wherein the predetermined second partitioned area contains the second greatest number of the specifications of systems from among the partitioned areas; and
   a second creation step of creating region-based connector/wiring information described for at least a predetermined wire harness from among second wire harnesses arrangeable in the second partitioned area, wherein the region-based connector/wiring information includes specifications of different systems in the second partitioned area;
   wherein the region-based connector/wiring information of each of the first partitioned area and the second partitioned area includes at least one common specification indicating at least one common system.

7. The wire harness conductivity inspection method according to claim 4, further comprising a final specification step of specifying a predetermined final partitioned area from among partitioned areas into which a vehicle space is partitioned, wherein the final specification step further indicates that the predetermined final partitioned area contains the least number of specifications of systems from among the partitioned areas, the region-based connector/wiring information of the final partitioned area includes at least one common specification indicating at least one common system;
   a creation step of creating region-based connector/wiring information described for at least a predetermined wire harness from among final wire harnesses arrangeable in the final partitioned area, wherein the region-based connector/wiring information includes specifications of different systems in the final partitioned area; and
   an inspection step of inspecting the presence/absence of an error in a connection of electric wires in the first and second partitioned areas while not inspecting the presence/absence of an error in a connection of electric wires in the final partitioned area.

* * * * *